United States Patent [19]

Byers et al.

[11] Patent Number: 5,434,818
[45] Date of Patent: Jul. 18, 1995

[54] FOUR PORT RAM CELL

[75] Inventors: Larry L. Byers, Apple Valley; Duane Kurth, Wyoming, both of Minn.; Ashgar K. Malik, Escondido, Calif.

[73] Assignee: Unisys Corporation, Blue Bell, Pa.

[21] Appl. No.: 173,379

[22] Filed: Dec. 23, 1993

[51] Int. Cl.⁶ .................................................. G11C 7/00
[52] U.S. Cl. ........................... 365/189.04; 365/230.05; 365/230.06
[58] Field of Search ................ 365/189.04, 230.05, 365/189.01, 230.06

[56] References Cited

U.S. PATENT DOCUMENTS

| | | | |
|---|---|---|---|
| 4,623,990 | 11/1986 | Allen et al. | 365/189.04 |
| 4,937,781 | 6/1990 | Lee et al. | 364/900 |
| 4,991,138 | 2/1991 | Cavaliere et al. | 365/154 |
| 5,111,431 | 5/1992 | Garde | 365/129.02 |
| 5,124,950 | 6/1992 | Fukushi et al. | 365/230.05 |
| 5,142,540 | 8/1992 | Glasser | 371/40.1 |
| 5,235,552 | 8/1993 | Nakajima et al. | 365/230.05 |
| 5,276,803 | 1/1994 | Iwase | 365/230.05 |
| 5,289,427 | 2/1994 | Nicholes et al. | 365/230.05 |

FOREIGN PATENT DOCUMENTS 4-278286  10/1992  Japan .

OTHER PUBLICATIONS

"Computer Engineering Handbook", McGraw-Hill, Inc., edited by C. H. Chen, 1992, pp. 14.8–14.9.

Primary Examiner—Joseph A. Popek
Assistant Examiner—Tan Nguyen
Attorney, Agent, or Firm—Nawrocki, Rooney & Sivertson

[57] ABSTRACT

A random access memory system having at least four independent access ports. In the preferred mode, a random access memory core is accessible by two independent read ports and two independent write ports. The four ports can separately and simultaneously access the same or different addressable locations within the random access memory core, except for collision conditions. A collision condition occurs whenever more than one write ports attempt to simultaneously write into the same addressable location. Such a simultaneous write access to the same cell could produce a metastable condition wherein the data storage state is indeterminate. Collision conditions result in the aborting of at least one of the write accesses on a priority basis. The abort function also protects the hardware from short circuit.

6 Claims, 12 Drawing Sheets

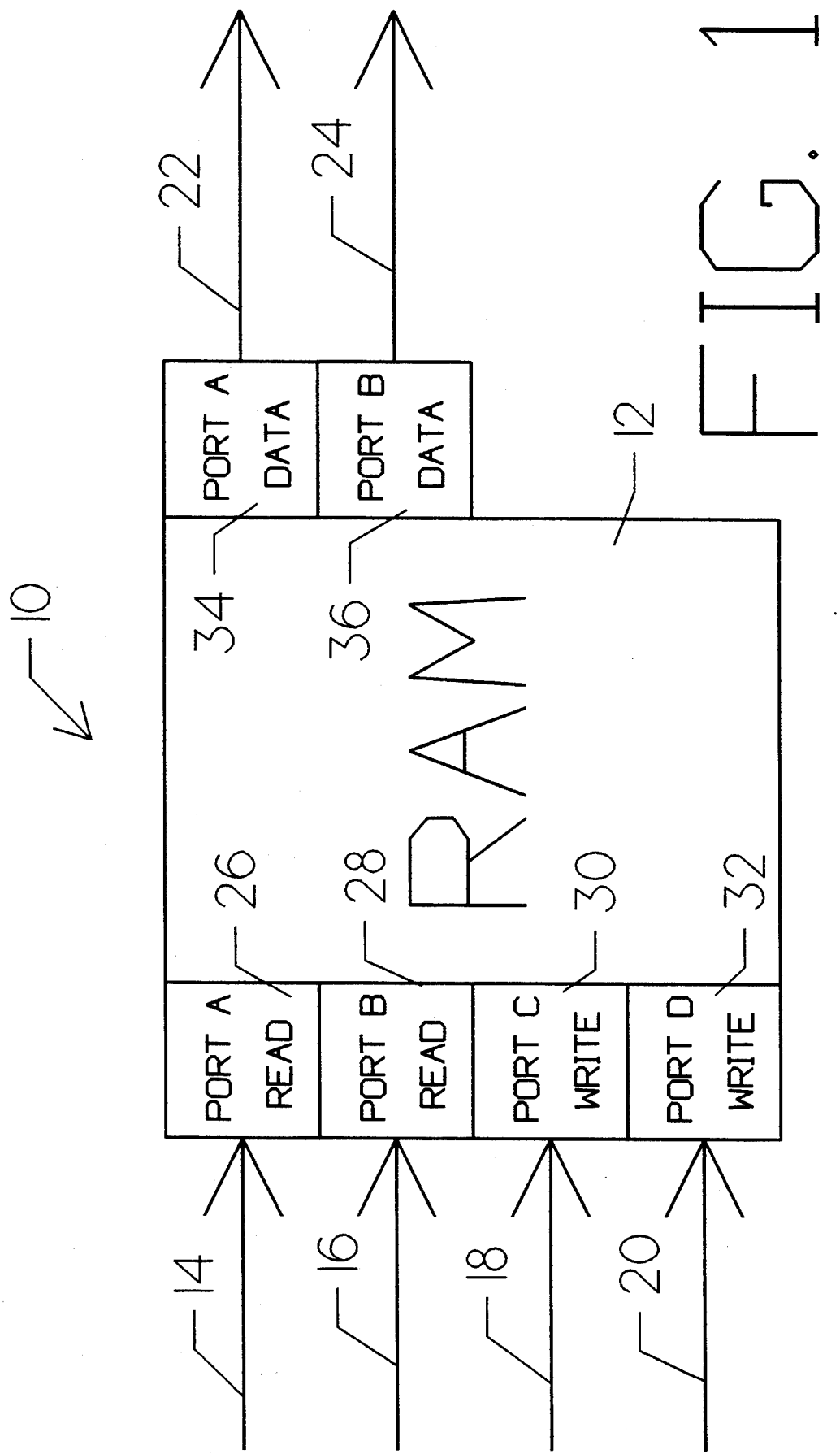

FOUR PORT RAM CELL

CROSS REFERENCE TO CO-PENDING APPLICATIONS

U.S. Ser. No. 07/975,381, filed Nov. 13, 1992 in the name of E. A. Rodi et al and entitled, "RESILIENT STORAGE SYSTEM" is assigned to the assignor of this invention and is incorporated herein by reference.

BACKGROUND OF THE INVENTION

1. Field of the Invention

The present invention is generally related to digital data storage elements and more particularly relates to digital data storage elements having a plurality of access ports.

2. Description of the Prior Art

The application of digital data storage to digital computation has been known for some time. As new and more powerful data processing hardware has been developed, corresponding improvements to memory technology have also occurred. However, the bandpass of memories has historically been a limiting factor on processing speed. Some of the improvements to memory systems involve enhancement to memory access time and memory cycle time directly. These techniques are concerned with the nature and characteristics of the individual storage elements themselves.

Effective memory bandpass has also been improved by system level, architectural changes. In the most basic terms, these approaches tend to focus on the arrangement of sequential and block memory locations. Interleaving of addressing from separate memory elements and overlapping of instruction and operand fetches to different memory elements have improved system level memory performance. With certain modern processor architectures, however, many instructions require two operands, which typically necessitates two serial accesses to memory. This produces up to 100% access penalty with normal overlap techniques, whereas an overlap design to optimize these accesses tends to be very complex.

A somewhat more recent development utilizes hierarchical memory systems of differing sizes and cycle times. The now popular use of cache memories falls within this category of improvement. Currently, many data processing systems use cache memories for performance enhancement.

Quite recently, system performance has been enhanced through the use of multiple port memories. The desirability of such a multiple port memory may be seen in "Computer Engineering Handbook", McGraw-Hill, Inc., edited by C. H. Chen, 1992, at pages 14.8–14.9. Even though this reference certainly does not provide an enabling disclosure, it does suggest system performance enhancement using multiple port memory elements. In constructing an actual multiple port memory, however, it is likely that the complete symmetry suggested by Chen is neither necessary nor desirable as explained below.

In multiple port memories, the effective pass band is improved by permitting more than one access to a single memory element. U.S. Pat. No. 4,937,781, issued to Lee et al. is an example of an early technique in which an arbitrator-selects one of two ports requesting access. Though this type of structure permits access by only one port at a time, overlapping of certain of the accessing functions does provide some performance enhancement.

An improvement to the multiport memory is found in U.S. Pat. No. 4,991,138, issued to Cavaliere et al. In its preferred mode, this technique uses a dual port memory in which some bunt all of the dual port functions may be overlapped in time. A further improvement is found in U.S. Pat. No. 5,124,950, issued to Fukushi et al. In this approach, a two port memory is implemented wherein a first port can read and a second port can write simultaneously. An error signal is generated whenever a simultaneous read and write access are attempted at the same memory cell. U.S. Pat. No. 5,111,431, issued to Garde provides two write ports and one read port. The two ports of a dual port memory are utilized for error detection in U.S. Pat. No. 5,142,540, issued to Glasser.

SUMMARY OF THE INVENTION

The present invention is a substantial advance over the prior art providing a four port memory, wherein two of the ports are read ports and two of the ports are write ports. The two write ports and the two read ports may operate asynchronously and may make simultaneous accesses to the memory. Separate circuitry detects collisions between write ports, whenever both of the write ports attempt to write data into the same cell. The conflict is resolved by granting priority to a predetermined one of the ports and aborting the access of the other write port.

Whether to employ completely synchronous operation of the multiple ports is a function of the specific application. For example in the preferred mode, the read ports are synchronized and the write ports operate asynchronously. On the other hand, totally synchronous operation may be optimal for synchronous users of the multiple access ports.

Without addressing conflicts wherein both write ports are attempting to simultaneously write into the same memory cell, the four port memory can provide four complete accesses (i.e. two read accesses and two write accesses) within a single memory cycle period. This results in an effective memory bandpass of up to four times that available from a single port memory having the same cycle time.

In the preferred mode, precharge circuits reduce the overall power consumption compared to that needed to achieve the same cycle time without precharge.

A primary advantage of the four port design is that it greatly simplifies various pipelined architectures by removing memory access delays as the major timing factor within the pipeline. As a result, fewer pipelined stages for a given performance are made possible.

The four port memory is also particularly suited to be imbedded within a larger VLSI logic network. Because the device readily handles four users without special priority logic, it can easily-be fabricated within a larger monolithic design. Such on-chip memory provides storage without the necessity to incur off-chip transmission delays.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 1 is a conceptual block diagram of a four port random access memory according to the preferred mode of the present invention;

DETAILED DESCRIPTION OF THE PREFERRED EMBODIMENTS

Figure 6:
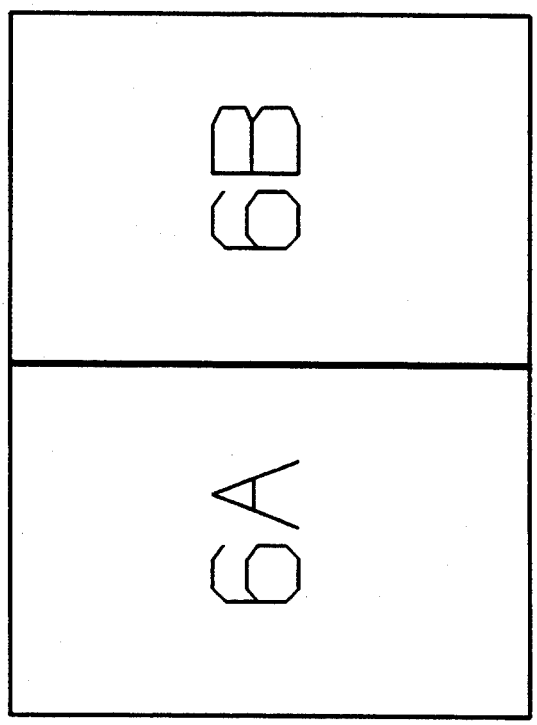
FIG. 6 consisting of FIG. 6A

FIG. 1 is an conceptualized block diagram of four port random access memory (RAM) 10 according to the preferred mode of the present invention. Four port RAM 10 has a memory array 12 of preferably 1024 k 36 bit words, has two read port interfaces 14 and 16, and has two write port interfaces 18 and 20. All four interfaces (i.e. 14, 16, 18, and 20) provide circuitry for the transfer of the address to be accessed and the necessary control signals to RAM 10. In addition, interfaces 18 and 20 provide for transfer to RAM 10 of the data to be written. Interfaces 22 and 24 provide for transfer of the data retrieved from RAM 10 to the requestor of read port A and read port B, respectively.

Read port A consists of read circuitry 26 and data circuitry 34. Read circuitry 26 receives and buffers the access address and performs the read control functions. Data circuitry 34 buffers the accessed data and controls the transfer via interface 22. Read port B, consisting of read circuitry 28 and data circuitry 36, functions in like manner.

The circuitry associated with write port C is located within write circuit 30. The logic contained therein, as explained in greater detail below, buffers the incoming write address until the access is made, buffers the data to be written until stored within the addressed cell of RAM 10, and controls the write operation. Write port D is similarly facilitated by write circuit 32.

Figure 2:
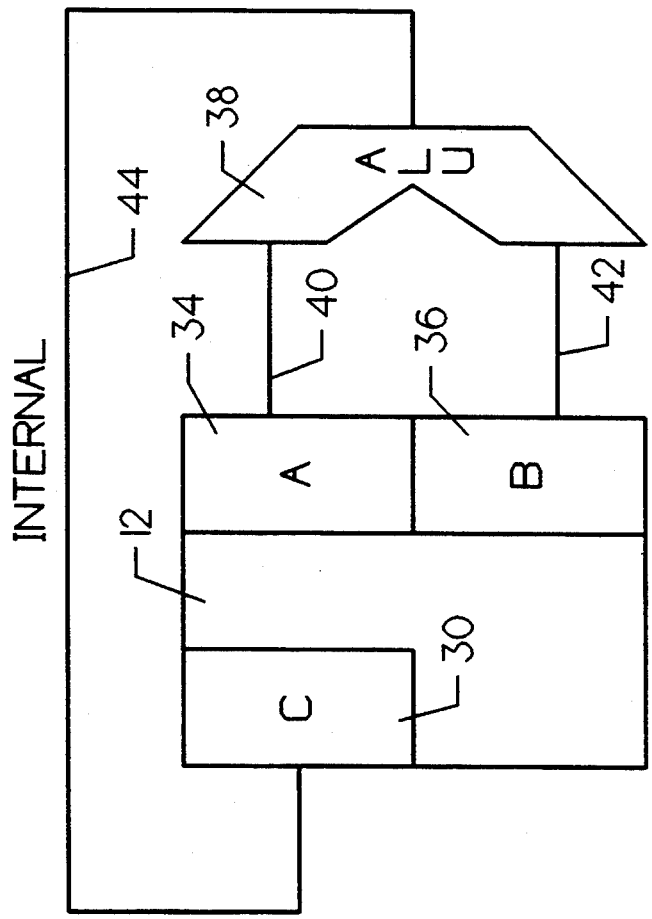
FIG. 2 is an overall logic block diagram of the four port RAM of FIG. 1.

FIG. 2 is a conceptualized block diagram of RAM 10 showing the interaction of the read and write ports for read-alter-write operations. The original data is read from read port A and/or read port B. This original data is buffered in data circuit 34 and/or data circuit 36 as with simple read operations. However, this original data is transferred via special paths 40 and 42 to internal arithmetic logic unit (i.e. ALU) 38 for the desired modification of the original data. Internal path 44 transfers the modified data to write port C, where it is buffered in write circuit 30 as in simple write operations. The modified data is then written into the addressed cell of memory array 12.

Figure 3:
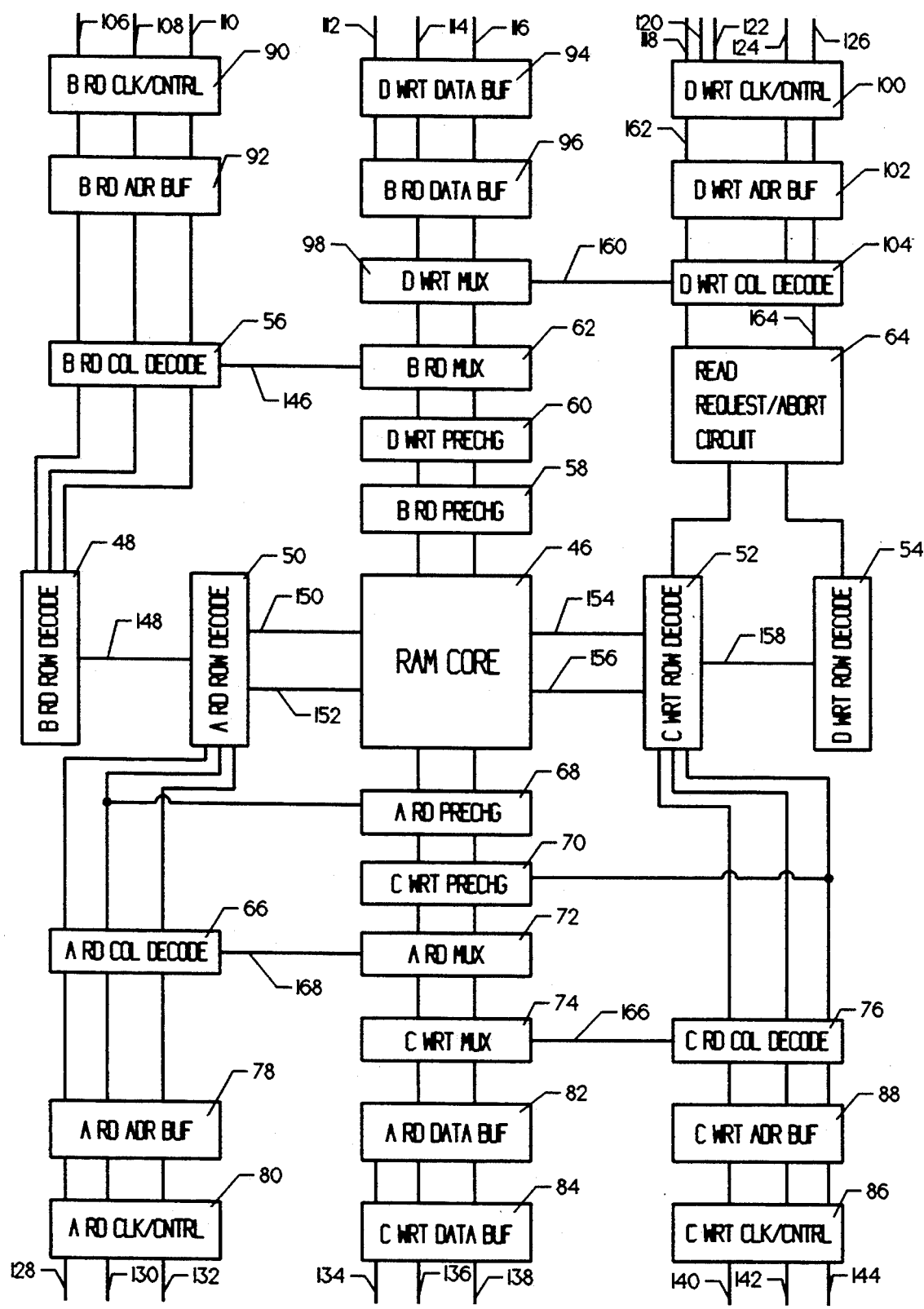
FIG. 3 is a detailed block diagram of the four port RAM.

FIG. 3 is a detailed block diagram of four port RAM 10. Ports A and B permit read accesses only, whereas ports C and D permit only write accesses. Therefore, the data is transferred from RAM core 46 to the requestor for ports A and B. Similarly, the data is transferred from the requestor to RAM core 46 for ports C and D. All ports must transfer an access address to RAM 10, along with the appropriate control signals.

For port A, for example, the access address, clock signal, and control signals are received by read clock/control circuit 80 via line 128, 130, and 132. The access address is stored temporarily in buffer 78. RAM core 46 is addressed in terms of an ordered pair of a row position and a column position. Decoder 66 provides the column information to multiplexer 72 for selection of the associated column. Similarly, the row information is supplied to row decoder 50 for indicating the selected row position via line 150. In this manner, the access address transferred on port A is converted to a unique row and column position for addressing RAM core 46.

The read access for port A is individually precharged by precharge circuit 68 to enhance performance. The data read from RAM core 46 by the port A read access is temporarily stored in buffer 82 for transfer to the port A requestor via line 134.

The port B address, clock, and control signals are received by read clock/control circuit 90 via lines 106, 108, and 110. The address to be accessed is stored in buffer 92 and decoded by column decoder 56, read multiplexer 62, and row decoder 48, as explained above with referenced to read port A. The address thus specified is precharged during the read operation by precharge circuit 58, and the data thus accessed is buffered in data buffer 96 for transfer via line 112.

For write port C, the requestor provides the clock signal, control information, and access address to write clock/control circuit 86 via lines 140, 142, and 144. The access address is temporarily stored in buffer 88, for decoding into row and column positions by column decoder 76, multiplexer 74, and row decoder 52. Buffer 84 temporarily stores the write data and control signals received via line 136 and 138 during the write operation. Write precharge is provided by the write port C addressed cell via precharge circuit 70.

Write port D operates in similar manner with write data, access address, clock signal, and control information received via lines 114, 116, 118, 120, 122, 124, and 126. The address and control information is received by clock/control circuit 100. The access address is stored by buffer 102 and decoded by column decoder 104, row decoder 54, and write multiplexer 98. Individual cell precharge is provided by precharge circuit 60 and write data is temporarily stored in buffer 94.

As can be appreciated from the preferred embodiment, simultaneous write accesses to the same cell can produce indeterminate results. This condition is to be distinguished from that in which one write is completed and then the other, wherein it is not readily known which has occurred first. True simultaneous accesses can result in a cell having a stored result which does not correspond to either write word. Therefore, request/abort circuit 64 determines whenever simultaneous accesses to the same cell by different ports is being attempted. In that situation, priority is given to one requestor, and the other request is aborted. The abort circuitry is explained in greater detail below.

Figure 4:
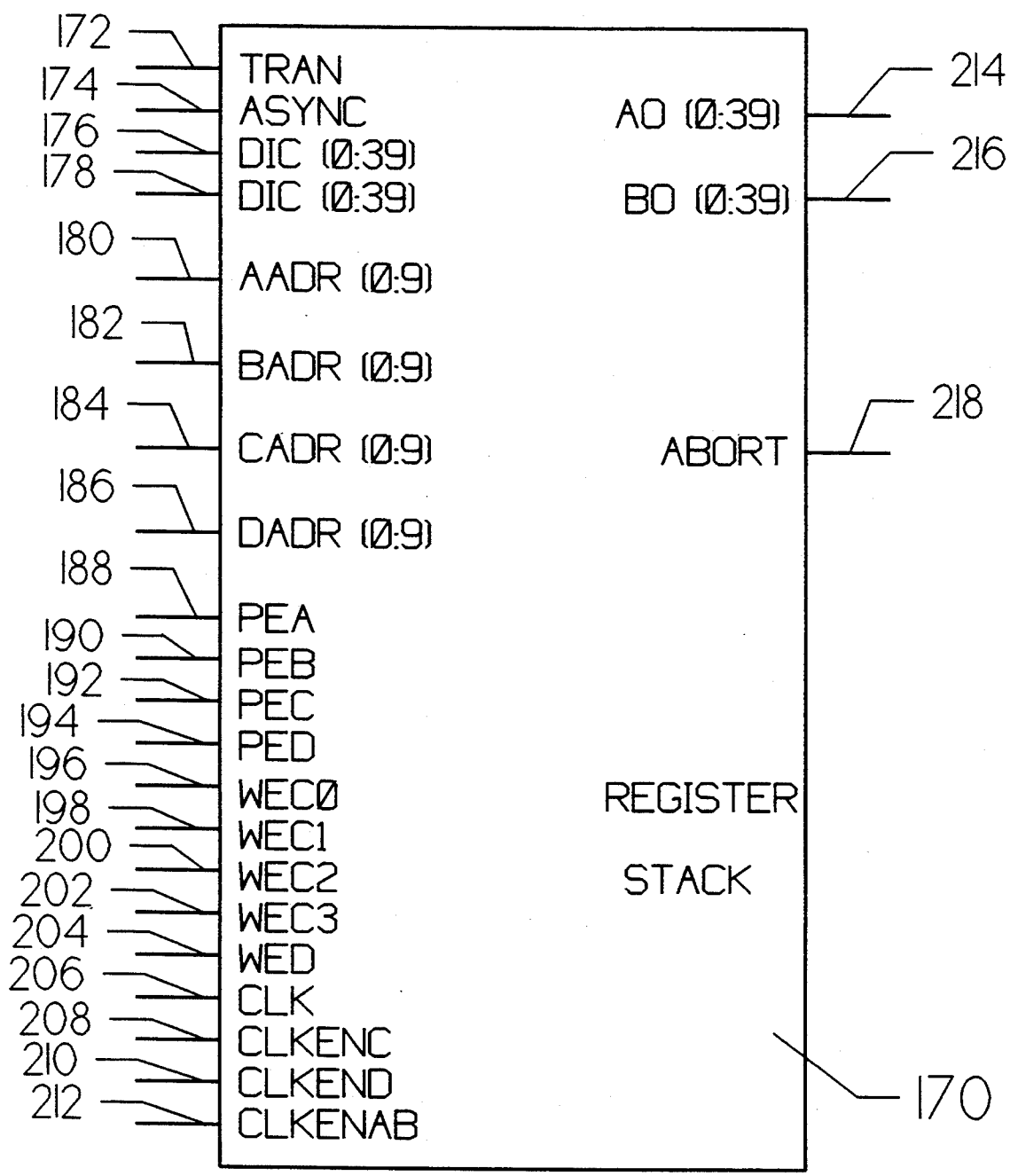
FIG. 4 is a diagram showing a packaged four port RAM.

FIG. 4 is and outline drawing of a packaged register stack device 170 in accordance with the present invention. As thus packaged, each register stack 170 contains 1,024 words of 40 bits each, having four bytes, each with 9 data bits and a dedicated parity bit.

Input 206 provides an overall clock signal. Individual clock enables for port C, port D, and ports A and B are found at inputs 208, 210, and 212, respectively. Individual write enables for the four bytes of write port C are found at inputs 196, 198, 200, and 202, respectively. Input 204 is a write-enable for all of write port D. Memory protection enables for ports A, B, C, and D are found at inputs 188, 190, 192, 194, respectively.

The ten bit address words for ports A, B, C, and D are presented to inputs 180, 182, 184, and 186, respectively. The 40 bit write words for ports C and D are provided to inputs 176 and 178, respectively. Asynchronous operation can be enabled by input 174. A transparent test signal on input 172 renders much of the circuitry transparent for testing purposes.

Read data after access is provided as 40 bit words to port A on output 214 and to port B on output 216. Output 218 indicates that a collision has occurred with two ports attempting to write into the same cell simultaneously, and one write request has been aborted.

Figure 5:
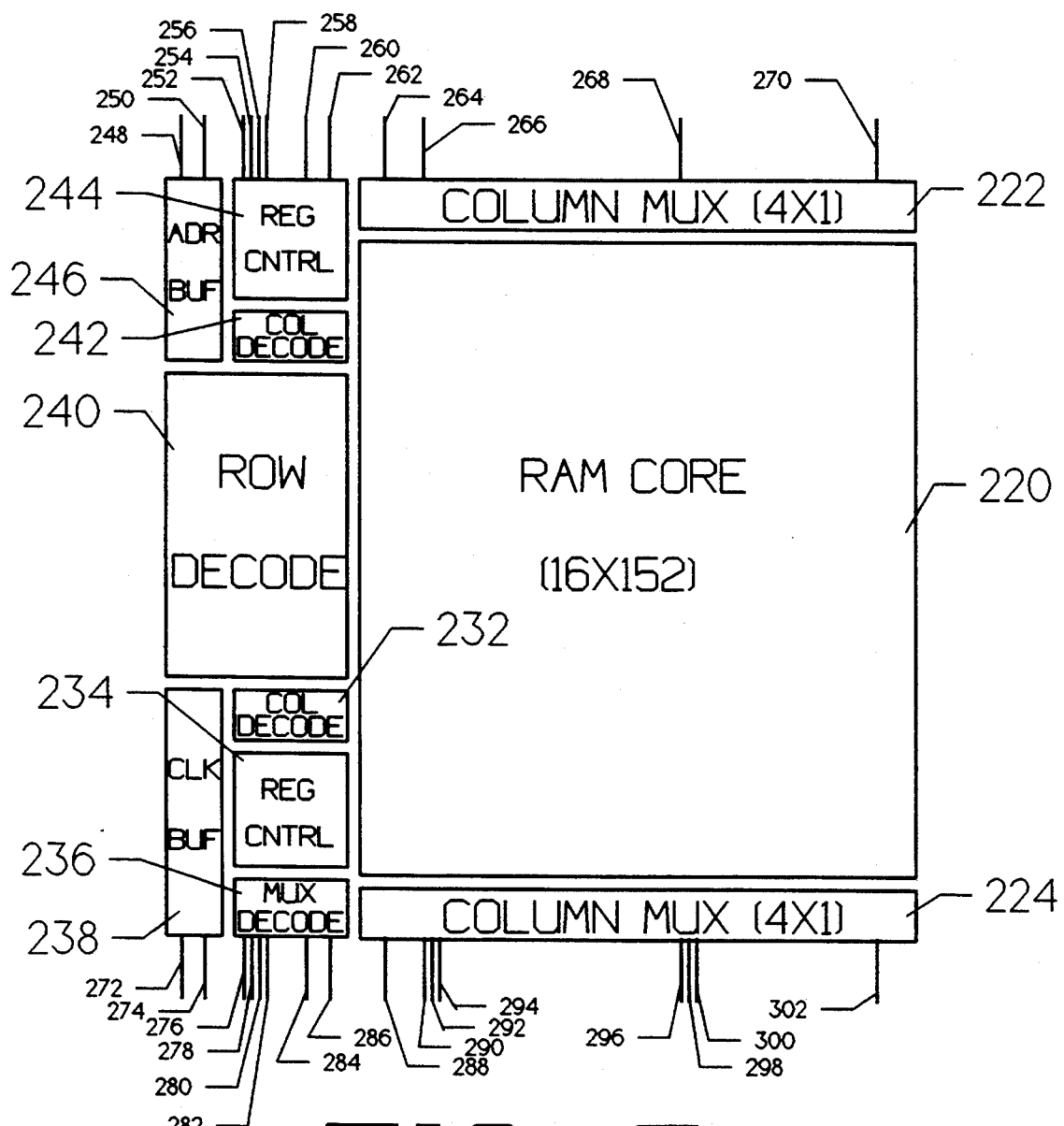
FIG. 5 is a diagram showing the physical layout of a four port RAM chip.

FIG. 5 is a diagram showing the physical layout of the register stack package. RAM core 220 is the largest of the main physical elements within the package. It provides 152 16 bit locations. As explained above, RAM core 220 is addressed by specifying the unique combination of row and column positions which define the cell to be accessed.

Column multiplexer 222 provides the circuitry to identify the column positions for read ports A and B. Similarly, column multiplexer 224 is the circuitry for identifying the column positions for write ports C and D. Column decoding is accomplished by column decoder 242 for the two read ports and by column decoder 232 for the two write ports. Row decoding for all four ports is accomplished by row decoder 240.

Initial multiplexing is provided by multiplexer decoder 236. Buffering of the address word for all four ports is found in address buffer 246. Similarly, clock buffer 238 provides temporary storage for clock control signals for all four access ports. Register control 244 offers the major control logic for the two read ports, whereas register control 234 performs the same function for the two write ports.

Figure 6A:
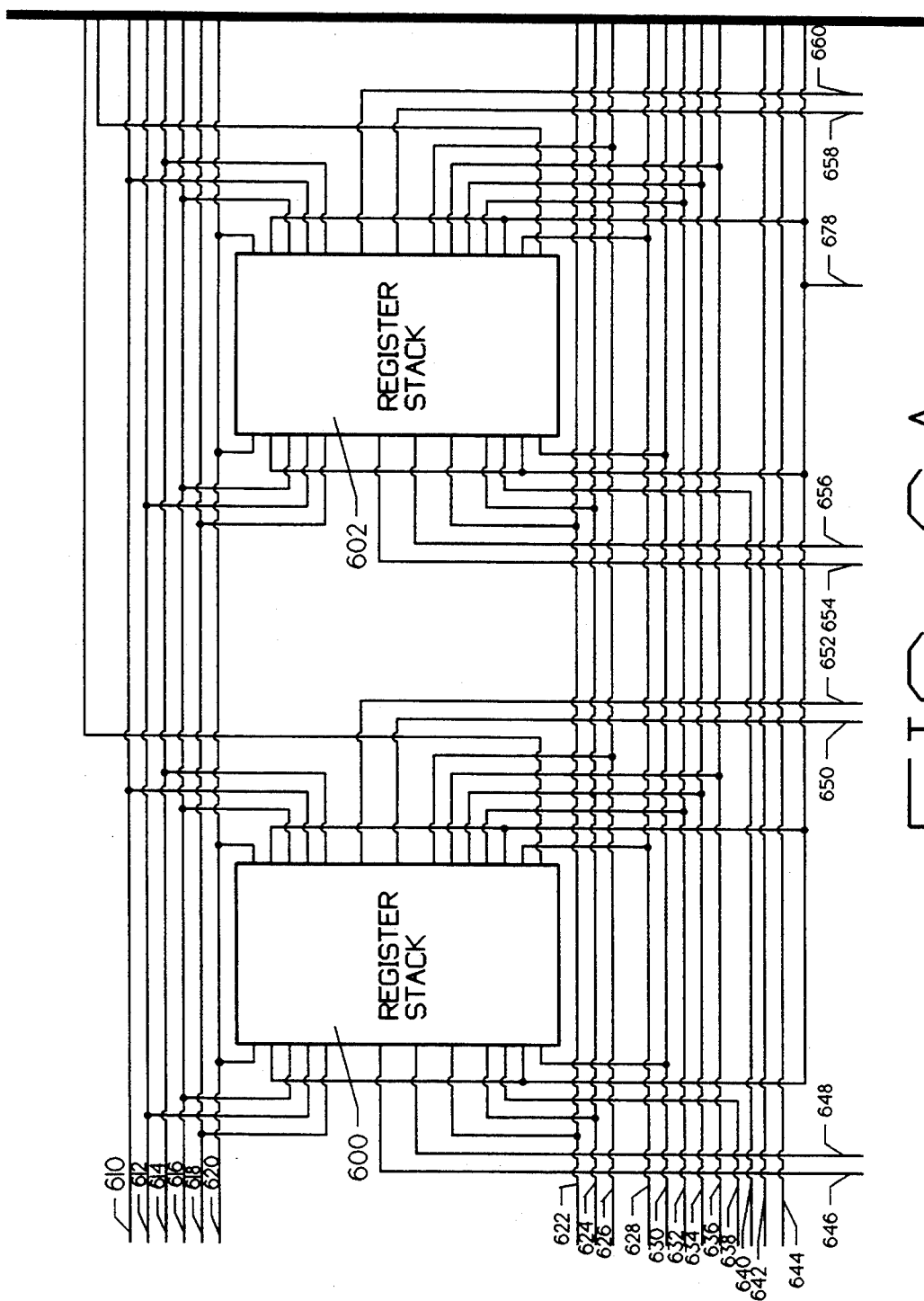
FIG. 6B is a schematic diagram of the four port RAM chip.
Figure 6B:
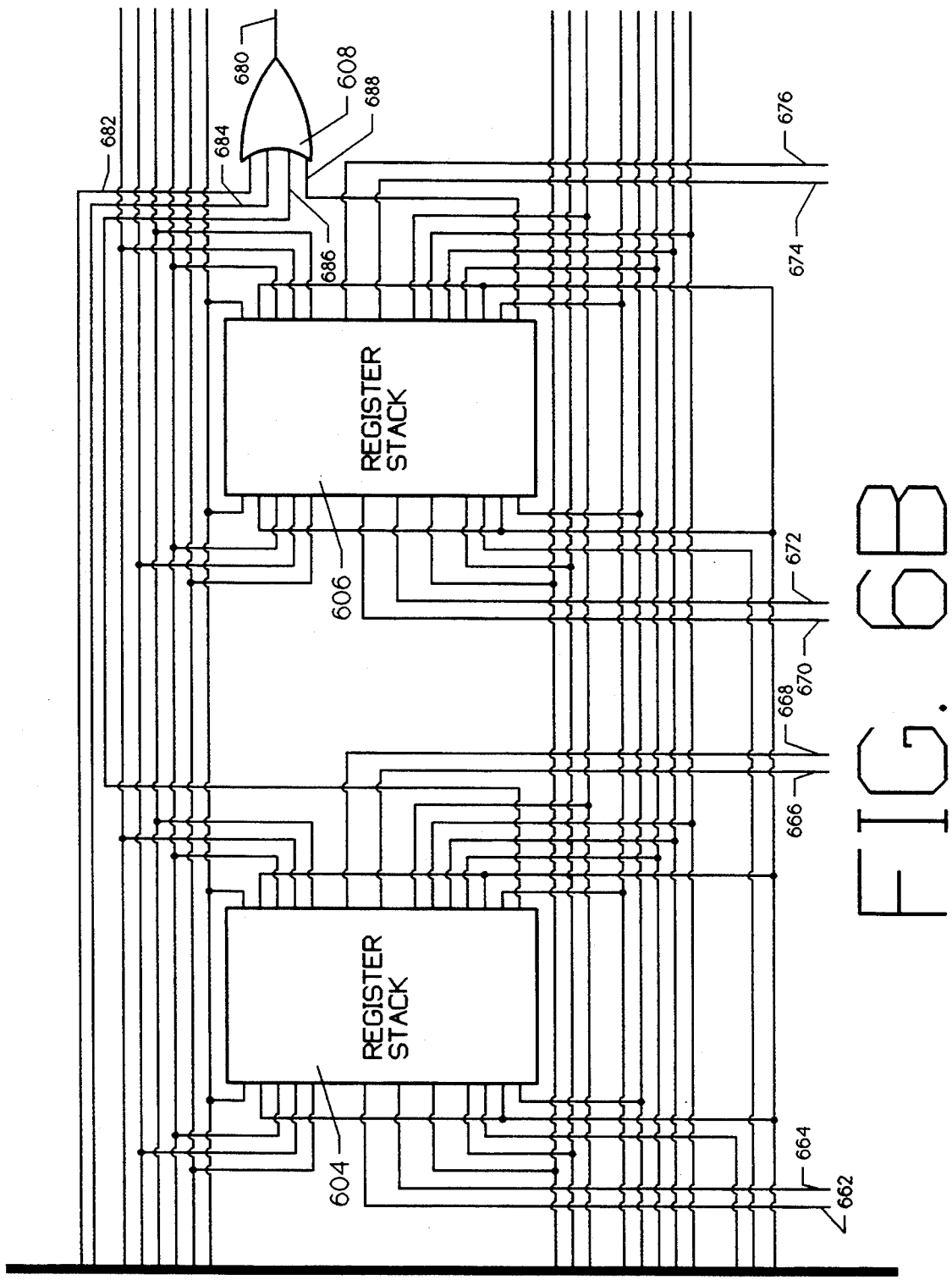

FIG. 6, comprising FIG. 6A and FIG. 6B, is a detailed schematic diagram of the interconnection of four register stack packages. In accordance with this, the preferred mode, register stack packages 600, 602, 604, and 606 are coupled to provide a single four port memory. Each of the register stack packages is as previously described (i.e. each package is a 1024 k word by 10 bit structure).

Lines 610, 612, and 624 are the protection enables which correspond to ports A, B, and C. Lines 614, 618, 622, and 626 are the address control lines for ports B, A, C, and D, respectively. Signals on these lines indicate the validity of addressing data on the addressing lines and specify to which port the address corresponds. Line 616 transfers the transparent test signal.

Clock enable signals for both read ports A and B are provided by line 620. However, write ports C and D each have dedicated clock enable lines 644 and 642, respectively. As explained above, write port C has separate write enables for each of the four bytes, which are placed on lines 634, 636, 638, and 640.

The data lines for register stack 600 are 652, 646, 650, and 648 for ports A, B, C, and D, respectively. The data lines for register stack 602 are 660, 654, 658, and 656 for ports A, B, C, and D. Similarly, data lines 668 and 676, data lines 662 and 670, data lines 666 and 674, and data lines 664 and 672 provide data transfer for ports A, B, C, and D, respectively, for register stacks 604 and 606.

As explained above, data collision necessarily requires the aborting of at least one access request. The collision condition is detected within the individual register stacks as discussed in more detail below. A collision detected by register stack 600 is indicated by a signal on line 682. Line 684 is used to indicate a collision detected by register stack 602. Similarly, register stacks 604 and 606 indicate detected collisions on lines 686 and 688, respectively. Or gate 608 is utilized to indicate on line 680 whenever a collision condition is detected by one or more register stacks.

Figure 7:
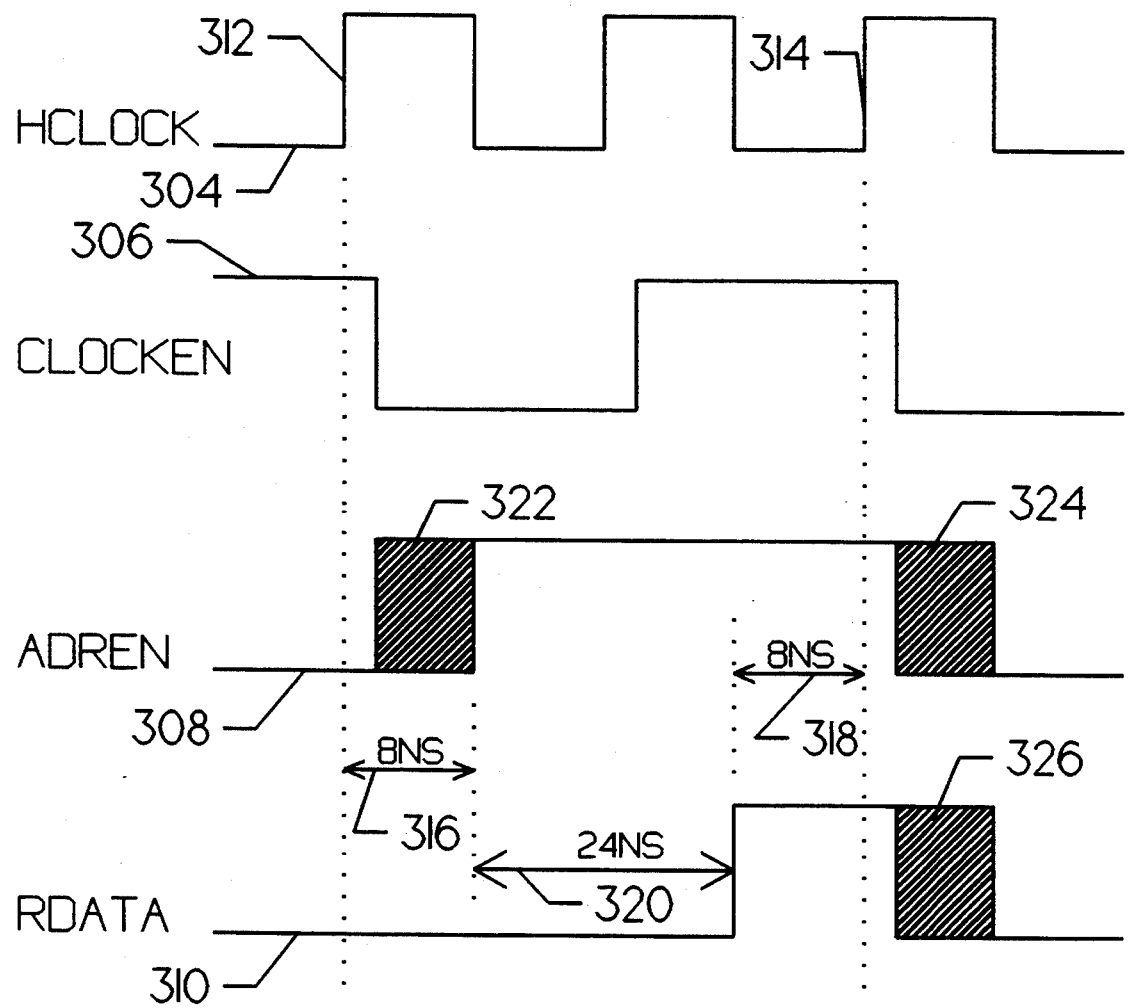
FIG. 7 is a basic timing diagram showing read access.

FIG. 7 is a timing diagram showing the key signals involved in a normal read access from either read port A or read port B. Clock signal 304 provides a continuous, periodic timing signal having precisely spaced clock pulses as exemplified by the three timing pulses shown. Leading edges 312 and 314 signal the beginning of two sequential read accesses. The read clock enable/write clock enable signal 306 provides enables for the internal registers and the internal RAM cell clock. The clock enable signal 306 has a duration of two main clock cycles, which is the time required to complete one read cycle, and has transitions which are slightly delayed due to normal gate delays.

The memory address to be accessed is provided on Port A or Port B as shown by timing line 308. Setup of the internal data paths for the memory read access is accomplished during time period 322. As shown by time line 316, this period, along with the normal gate delays, is approximately 8 nanoseconds.

Timing line 310 shows the availability of the read data. Time period 320, which is about 24 nanoseconds, is the time actually required to fetch the read data from the RAM cell. This time period begins immediately after the end of the setup. The accessed read data is thus available on the output lines during 8 nanosecond time period 318. The transition period 326 at the end of the read access occurs at the same time as setup period 324, corresponding the next sequential read access. Thus the content of the data output lines following leading edge 314 should be considered indeterminate. As explained above, leading edge 314 signifies the initiation of the next sequential read access.

Figure 8:
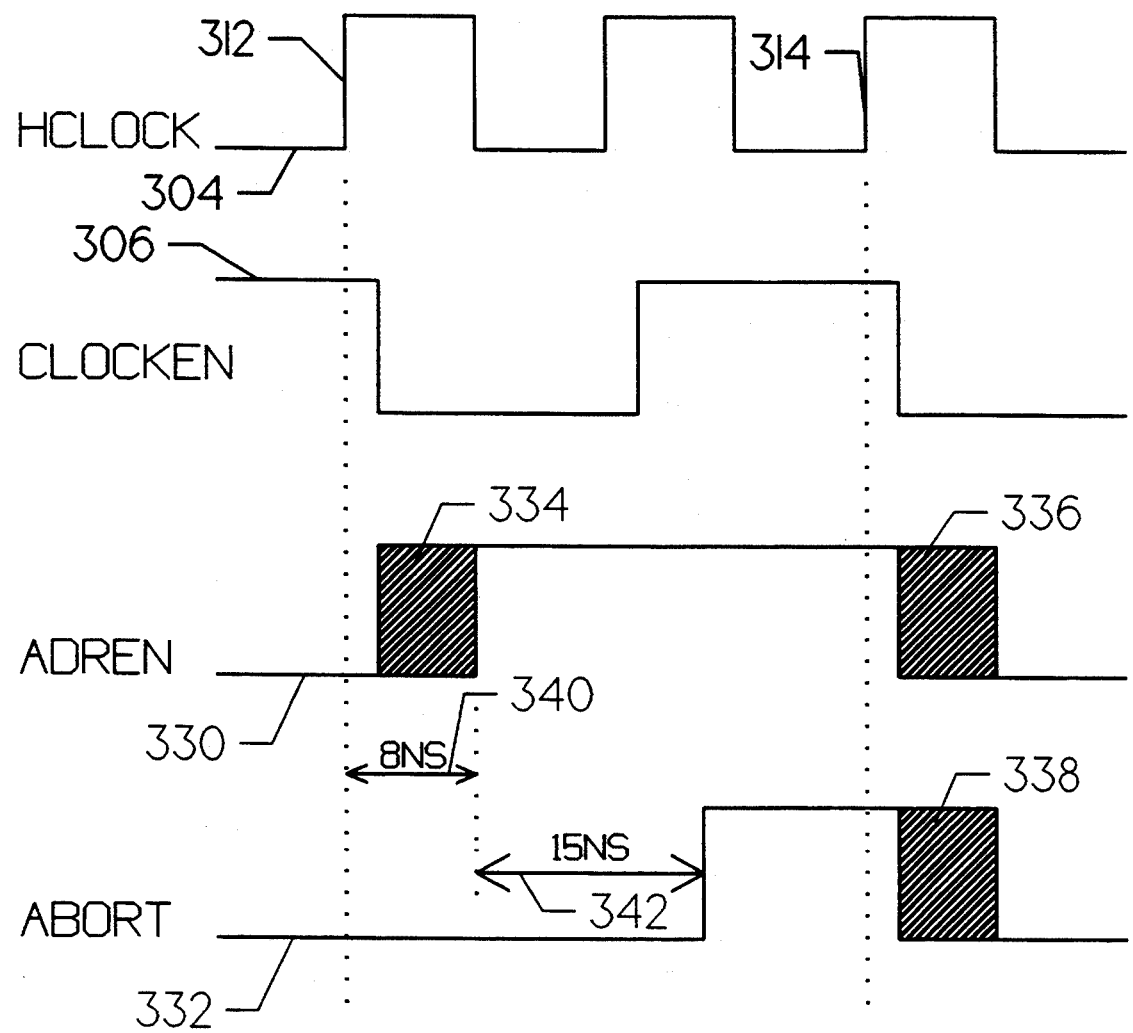
FIG. 8 is a basic timing diagram showing synchronous write access.

FIG. 8 is a timing diagram showing a normal write access cycle in the synchronous mode. That means that the Port C and Port D write accesses are clocked synchronously by coupling both to the same clock enable, thus potentially producing two write functions during each complete write cycle. Clock signal 304 is reproduced as in FIG. 7. The write access similarly requires two complete cycles of the main clock. Therefore, leading edge 312 corresponds to the initiation of the first write cycle, and leading edge 314 corresponds to the next sequential write cycle.

The clock enable signal 306 enables the registers and internal RAM clock as discussed above. Timing line 330 indicates placement of the write address(es) on the input lines to the RAM cell. Setup for the write is accomplished during time period 334, which ends about 8 nanoseconds after leading edge 312 (i.e. the start of the write cycle) as shown by time line 340. Time period 336 corresponds to the setup time period for the next sequential write cycle.

Should the two write access ports (i.e. Port C and Port D) attempt to write simultaneously into the same location, the write cycle is aborted as shown along time line 332. In this case, the two addresses transmitted according to time line 330 and setup during time period 334 are compared during the 15 nanosecond time period 342 and determined to be equal. This results in an abort signal to notify the port users of that a write access has been aborted. Time period 338, corresponding to the setup time period 336 of the next sequential write cycle, represents the time period in which the state of the abort notification control signal is indeterminate. The generation and timing of the abort condition is explained in greater detail below.

Figure 9:
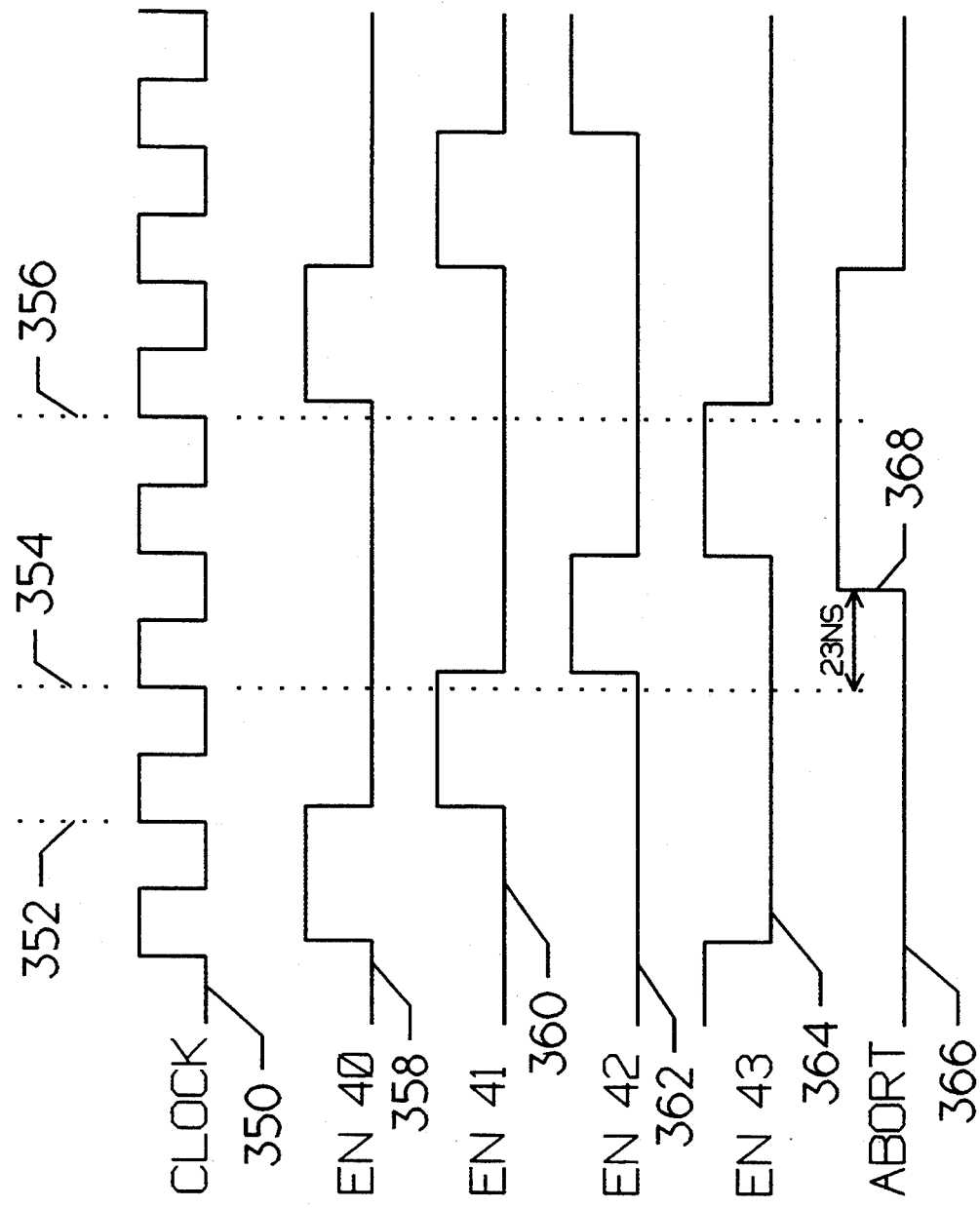
FIG. 9 is a basic timing diagram showing asynchronous write access.

FIG. 9 is a timing diagram showing simultaneous asynchronous write operations from Port C and Port D. This occurs when Port C and Port D utilize different clock enable signals. Clock signal 350 is the same as clock signal 304 of FIGS. 7 and 8 with more iterations shown. Leading edge 352 indicates the beginning of the Port C write access, and leading edge 354 initiates the Port D write access. For the purposes of perspective, leading edge 356 is shown which signifies the beginning of read accesses by Port A and Port B.

Clock enable signal 40, shown as timing line 358, provides register and internal RAM enable functions for Port C, similar to clock enable signal 306 for synchronous write accesses (see also FIG. 8). The Port C address enable is provided by clock enable signal 41, shown on time line 360. This function corresponds to the address enable signal 330 for the synchronous write accesses (see also FIG. 8).

The asynchronous write access of Port D is similarly controlled by clock enable signal 42, shown on time line 362, and by clock enable signal 43, shown on time line 364. These signals directly correspond to Port C controlling clock enable signal 40 and clock enable signal 41, respectively.

The abort function for the asynchronous write accesses is shown on time line 366. Leading edge 368 indicates the time at which the results of the write address comparison has been completed. This occurs about 23 nanoseconds after leading edge 354 which represents the initiation of the Port D (i.e. second) write cycle. The abort signal will ordinarily be sampled at the leading edge 356, which initiates read accesses from Port A and Port B. The timing of the abort function is discussed in more detail below.

Figure 10:
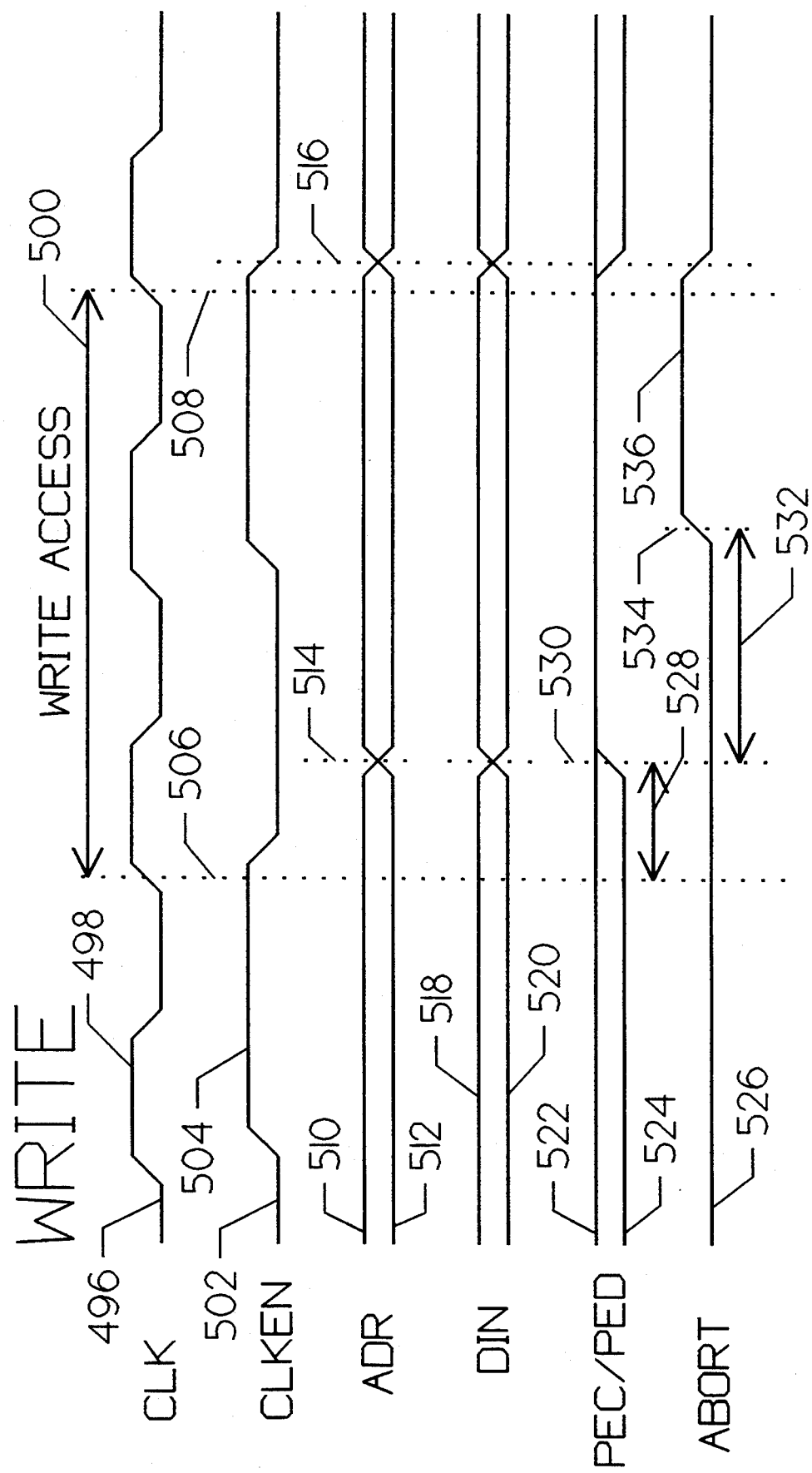
FIG. 10 is a detailed timing diagram for an abort as a result of a write collision; and, FIG. 11 is a schematic diagram showing the operation of a single storage bit of the four port RAM.

FIG. 10 is a timing diagram of a write access cycle in which a write collision is detected. As explained above, this condition results from an attempt to simultaneously write into a single memory cell from two write access ports. The four port random access memory resolves the condition by aborting at least one of the write access requests based upon a predetermined physical priority.

Clock signal 496, having representative clock pulse 498, again provides the timing reference. Clock enable signal 502, with representative clock enable pulse 504, initiates the write access cycle 500 at time 506 as explained above. The write access cycle 500 continues for two complete clock cycles until time 508.

Address signals 510 and 512 become valid at time 514 (i.e. shortly after initiation of the write access cycle) and remain so until time 516 (i.e. shortly after the end of the write access cycle). Data input signals 518 and 520 are similarly timed as discussed above. Time 514 is delayed from the initiation of the write access cycle (i.e. time 506) by time period 528.

Time 514 is determined by the trailing edge 530 of pulse 524 of write port C enable and write port D enable 522. In this example, the two write ports are operated synchronously. Abort signal 526 generates abort pulse 536 between time 534 and time 516 to notify that the requested write access has been aborted. Time delay 532 is required to compare the address words, which are not validly present until time 514, and generate abort pulse 536 indicating a collision condition.

Figure 11:
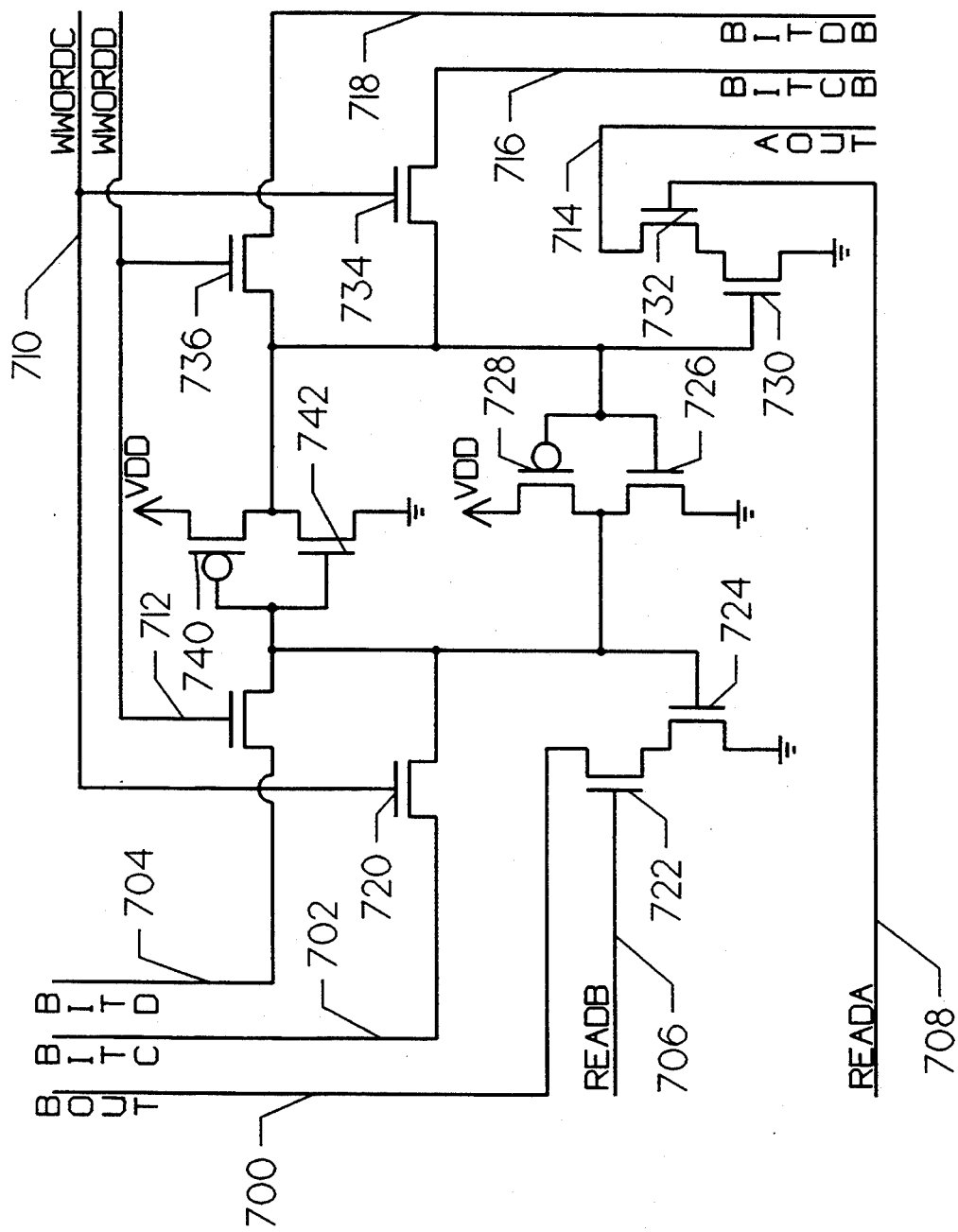

FIG. 11 is a detailed electrical schematic diagram of a single one-bit cell of the four port random access memory. The data value of the one-bit cell (i.e. whether it is a one or a zero) is stored in the complementary transistor pairs 740/742 and 726/728. Depending upon the data value stored, these transistor pairs will hold one side (e.g. gate of transistor 724) near the supply voltage (i.e. VDD) and the other side (e.g. gate of transistor 730) near ground complementing the data store reverses the electrical polarity at these points.

The state of complementary transistor pairs 740/742 and 726/728 may be read by read port A by activating line 708 which is uniquely addressed during the read access cycle. The read signal on line 708 applied to the gate of transistor 732 switches it on. This connects the drain of transistor 730, which is either near the supply voltage or ground depending upon the data bit stored, to output line 714 which is coupled to the read port A buffer register. Note that each of the cells of the entire memory system is coupled via the port A output line to the read port A buffer register. However, the register receives the value (i.e. one or zero) only from the one cell for each bit position which is uniquely addressed. Read port B similarly reads the state of the cell via line 700 through the read signal on line 706, along with transistor 724 and transistor 722.

Data is written into complementary transistor pairs 740/742 and 726/728 from write port D by placing the value to be written on line 702 and the complement of the value on line 716. Activation of line 710 which uniquely addresses the cell shown switches on transistors 720 and 734 to enable storage of the value in complementary transistor pairs 740/742 and 726/728. Write port D operates in similar fashion using bit line 704, complementary bit line 718, and word line 712 using the coupled transistor gates.

As can be seen from this schematic diagram, a cell can be accessed simultaneously by either one or both read ports and by one write port. However, simultaneous access by both write ports could cause at least a metastable condition and perhaps even a short circuit depending upon the timing and the data to be stored. Therefore, the collision detection and write access abort functions described above are necessary to protect the integrity of the stored data and the functionality of the hardware.

In the preferred mode of the present invention, four ports comprising two read ports and two write ports are used. However, those of skill in the art will readily appreciate that yet other ports may be added by using a larger number of separate read lines and/or a larger number of word and bit lines, along with the requisite and buffering circuitry.

Having thus described the preferred embodiments of the present invention, those of skill in the art Will be readily able to apply the teachings found herein to yet other embodiments within the scope of the claims hereto attached.

What is claimed is:

1. A memory device for use in a digital computer system comprising;
   a. a plurality of memory cells wherein each of the plurality of memory cells stores a one bit of data, the one bit of data having a value; each one of the plurality of memory cells having a first word line, a second word line, a third word line, a fourth word line, a first bit line, a second bit line, a third bit line, a fourth bit line, a fifth bit line, and a sixth bit line; the first bit line having a first write data bit contained thereon and the second bit line having the inverse of the first write data bit contained thereon; the third bit line having a second write data bit contained thereon and the fourth bit line having the inverse of the second write data bit contained thereon; the first word line enabling the corresponding memory cell to store the first write data bit that is contained on the first bit line into the corresponding memory cell; the second word line enabling the corresponding memory cell to store the second write data bit that is contained on the third bit line into the memory cell; the third word line enabling the corresponding memory cell to impose the value of the one bit of data contained therein onto the fifth bit line; the fourth word line enabling the corresponding memory cell to impose the value of the one bit of data contained therein onto the sixth bit line;
   b. a first address port communicatively coupled to said plurality of memory cells for enabling said first word line of a predetermined number of said plurality of memory cells;
   c. a first data port communicatively coupled to said plurality of memory cells for imposing said first write data bit onto said first bit line of the predetermined number of said plurality of memory cells that are enabled by said first word line and said inverse of said first write data bit onto said second bit line of the predetermined number of said plurality of memory cells that are enabled by said first word line;
   d. a second address port communicatively coupled to said plurality of memory cells for enabling said second word line of a predetermined number of said plurality of memory cells;
   e. a second data port communicatively coupled to said plurality of memory cells for imposing said second write data bit onto said third bit line of the predetermined number of said plurality of memory cells that are enabled by said second word line and said inverse of said second write data bit onto said fourth bit line of the predetermined number of said plurality of memory cells that are enabled by said second word line;
   f. a third address port communicatively coupled to said plurality of memory cells for enabling said third word line of a predetermined number of said plurality of memory cells;
   g. a third data port communicatively coupled to said plurality of memory cells for reading the value of the fifth bit line of the predetermined number of said plurality of memory cells that are enabled by said third word line;
   h. a fourth address port communicatively coupled to said plurality of memory cells for enabling said fourth word line of a predetermined number of said plurality of memory cells; and
   i. a fourth data port communicatively coupled to said plurality of memory cells for reading the value of the sixth bit line of the predetermined number of said plurality of memory cells that are enabled by said fourth word line.

2. A memory device according to claim 1 further comprising:
   j. a first address decoder circuit for decoding a first address imposed on the first address port of the memory device for enabling said first word line of a predetermined number of said plurality of memory cells;
   k. a second address decoder circuit for decoding a second address imposed on the second address port of the memory device for enabling said second word line of a predetermined number of said plurality of memory cells;
   l. a third address decoder circuit for decoding a third address imposed on the third address port of the memory device for enabling said third word line of a predetermined number of said plurality of memory cells; and
   m. a fourth address decoder circuit for decoding a fourth address imposed on the fourth address port of the memory device for enabling said fourth word line of a predetermined number of said plurality of memory cells.

3. A memory device according to claim 2 further comprising:
   a. a collision detector circuit for determining when the first address and the second address have a predetermined relationship.

4. A memory device according to claim 3 wherein the collision detector circuit aborts the first write operation when the collision detector circuit determines that the first address and the second address have said predetermined relationship.

5. A memory device according to claim 4 wherein the collision detector circuit issues an abort signal when said collision detector circuit determines that the first address and the second address have said predetermined relationship; said abort signal notifying a user of said first address port that a corresponding write access has been aborted.

6. An apparatus having at least one memory cell wherein each memory cells comprises:
   a. a first inverter having an input and an output;
   b. a second inverter having an input and an output wherein the input of the second inverter is coupled to the output of the first inverter and the output of the second inverter is coupled to the input of the first inverter;
   c. a first transistor having a gate, a drain and a source; the gate of the first transistor is coupled to a first word line; the drain of the first transistor is coupled to the output of the second inverter; the source of the first transistor is coupled to a first bit line;
   d. a second transistor having a gate, a drain and a source; the gate of the second transistor is coupled to a second word line; the drain of the second transistor is coupled to the output of the second inverter; the source of the second transistor is coupled to a second bit line;
   e. a third transistor having a gate, a drain and a source; the gate of the third transistor is coupled to the first word line; the drain of the third transistor is coupled to the output of the first inverter; the source of the third transistor is coupled to a third bit line;
f. a fourth transistor having a gate, a drain and a source; the gate of the fourth transistor is coupled to the second word line; the drain of the fourth transistor is coupled to the output of the first inverter; the source of the fourth transistor is coupled to a fourth bit line;
g. a fifth transistor having a gate, a drain, and a source; the gate of the fifth transistor is coupled to the output of the second inverter; the source of the fifth transistor is coupled to a power supply;
h. a sixth transistor having a gate, a drain, and a source; the gate of the sixth transistor is coupled to a third word line; the source of the sixth transistor is coupled to the drain of the fifth transistor; the drain of the sixth transistor is coupled to a fifth bit line;
i. a seventh transistor having a gate, a drain, and a source; the gate of the seventh transistor is coupled to the output of the first inverter; the source of the seventh transistor is coupled to a power supply; and
j. a eighth transistor having a gate, a drain, and a source; the gate of the eighth transistor is coupled to a fourth word line; the source of the eighth transistor is coupled to the drain of the seventh transistor; the drain of the eighth transistor is coupled to a sixth bit line.

* * * * *